(12) United States Patent
Keirn et al.

(10) Patent No.: US 7,102,549 B1
(45) Date of Patent: Sep. 5, 2006

(54) METHOD AND APPARATUS FOR PROGRAMMABLE CODEWORD ENCODING AND DECODING USING TRUNCATED CODEWORDS

(75) Inventors: Zachary Keirn, Loveland, CO (US); Richard Rauschmayer, Longmont, CO (US); Hongwei Song, Longmont, CO (US); Peter D. Stroud, Longmont, CO (US); Fan Zhou, Bethlehem, PA (US)

(73) Assignee: Agere Systems Inc., Allentow, PA (US)

( * ) Notice: Subject to any disclaimer, the term of this patent is extended or adjusted under 35 U.S.C. 154(b) by 0 days.

(21) Appl. No.: 11/095,766

(22) Filed: Mar. 31, 2005

(51) Int. Cl.
*H03M 7/46* (2006.01)

(52) U.S. Cl. .......................... 341/63; 341/67

(58) Field of Classification Search ............ 341/60–70, 341/106, 107; 382/246
See application file for complete search history.

(56) References Cited

U.S. PATENT DOCUMENTS

| | | | | |
|---|---|---|---|---|
| 5,392,037 A * | 2/1995 | Kato | ........................ | 341/67 |
| 5,861,921 A * | 1/1999 | Shimizu et al. | ........ | 375/240.04 |
| 6,366,614 B1 * | 4/2002 | Pian et al. | ............. | 375/240.02 |
| 6,396,958 B1 * | 5/2002 | Wilson | ....................... | 382/246 |
| 6,404,933 B1 * | 6/2002 | Yamamoto | ................... | 382/251 |
| 6,456,655 B1 * | 9/2002 | Suzuki | .................. | 375/240.03 |
| 6,646,578 B1 * | 11/2003 | Au | ............................... | 341/67 |
| 6,957,156 B1 * | 10/2005 | Jo et al. | ...................... | 702/51 |

\* cited by examiner

*Primary Examiner*—Lam T. Mai

(57) ABSTRACT

Methods and apparatus are provided for programmable codeword encoding and decoding. Data blocks are represented as a number of codewords. Data is encoded into one or more full size codewords and at least one truncated codewords. Typically, data is encoded and decoded using one or more full size codewords and one truncated codeword. The truncated codewords are a two-dimensional array having a number of columns (or rows or both) less than the full size codeword. In this manner, the disclosed truncated codewords are adaptable to various system parameters that affect code rate.

20 Claims, 1 Drawing Sheet

METHOD AND APPARATUS FOR PROGRAMMABLE CODEWORD ENCODING AND DECODING USING TRUNCATED CODEWORDS

FIELD OF THE INVENTION

The present invention relates generally to techniques for digital communication and storage and, more particularly, to techniques for encoding and decoding data for such digital communication and storage systems.

BACKGROUND OF THE INVENTION

Error correction techniques are used in a number of communication and storage systems. Error correction codes, such as Reed-Solomon codes, add one or more redundant bits to a digital stream prior to transmission or storage, so that a decoder can detect and possibly correct errors caused by noise or other interference. One class of error correction codes are referred to as "turbo" codes. Generally, turbo codes employ a combination of two or more systematic convolutional or block codes. Typically, an iterative decoding technique is employed where the output of each decoding step serves as an input to the subsequent decoding step. Turbo encoders typically employ a limited number of programmable choices of block size. The number of bits generated for each input block depends on the size of the input block, as well as the amount of redundancy added by the encoder.

In block coding, the data to be transmitted is broken into smaller blocks and each block is separately encoded. Generally, redundant bits are appended to each block of data. A block code is referred to as an (n, k) code, where n is the total number of bits in the encoded transmission block and k is the number of bits in the unencoded message block. Thus, n-k redundancy bits, also referred to as parity bits, are added to the message block during encoding.

Turbo Product Codes are a well known class of error correction codes that use a block parity mechanism, whereby a number of parity bits are added to each block of data prior to transmission or storage. Product codes generally arrange two dimensional codes (n, k) into (r×c arrays of r rows and c columns. Data is encoded as a two-dimensional codeword. Typically, one row and one column contain parity bits for columns and rows, respectively. The size of the codeword (i.e., the number of rows and columns) directly affects the code rate and the redundancy per user bit. For example, if a codeword size is 20 rows by 20 columns, and one row and one column contain parity bits, each codeword contains 361 bits of user data (400−20−19). The code rate is thus (400−39)/400.

When the amount of data to be transmitted does not completely fill an integer number of codewords, the final codeword is only partially filled with valid data and the code ratesuffers. In addition, system requirements vary so that one codeword size does not satisfy all systems. For example, a number of configurable parameters, such as choice of modulation code, error correction code, sector size, and format efficiency, affect the optimal codeword size for efficient transmission. While one system may transmit or store data in units of 512 bytes, another system may transmit or store data in units of 560 bytes. For example, in a storage application, one storage system may employ a sector size of 512 bytes, and another may employ a sector size of 560 bytes. Meanwhile, a manufacturer of the encoders/decoders employed in such systems does not want to provide a unique encoder/decoder solution for each application.

A need therefore exists for improved methods and apparatus for codeword encoding and decoding over a range of transmission sizes.

SUMMARY OF THE INVENTION

Generally, methods and apparatus are provided for programmable codeword encoding and decoding. Data blocks are represented as a number of codewords. Data is encoded into one or more full size codewords and at least one truncated codewords. Typically, data is encoded and decoded using one or more full size codewords and one truncated codeword. The truncated codewords are a two-dimensional array having a number of columns (or rows or both) less than the full size codeword.

A more complete understanding of the present invention, as well as further features and advantages of the present invention, will be obtained by reference to the following detailed description and drawings.

DETAILED DESCRIPTION

The present invention provides a programmable codeword encoder/decoder design that enables the flexible use of both fixed sized codewords and truncated codewords in an iterative decoding system. The efficient mapping of data onto fixed sized codewords and truncated codewords directly impacts the code rate and error correction performance of a system. The disclosed flexible codewords improve the efficiency of the encoding/decoding system by matching the codeword definition to the particular system requirements.

Figure 1:
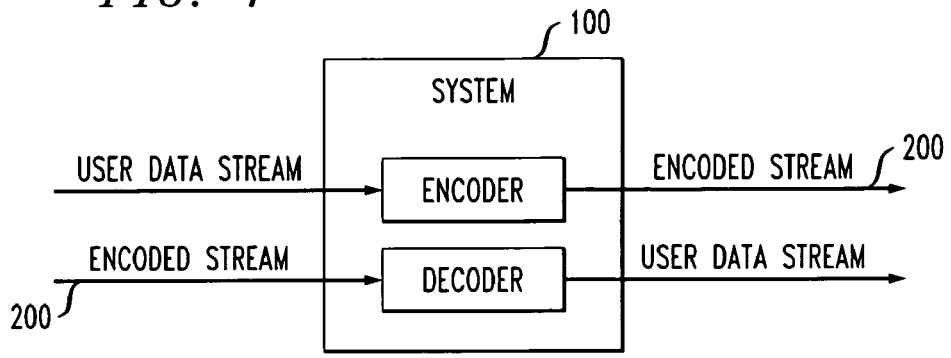
FIG. 1 is a schematic block diagram of an encoding/decoding system incorporating features of the present invention.

FIG. 1 is a schematic block diagram of an encoding/decoding system 100 incorporating features of the present invention. As shown in FIG. 1, in an encoding mode, the system 100 encodes bits from a user data stream into an encoded stream 200, discussed below in conjunction with FIG. 2. Likewise, in a decoding mode, the system 100 decodes a received encoded stream 200 into the original user data.

Figure 2:
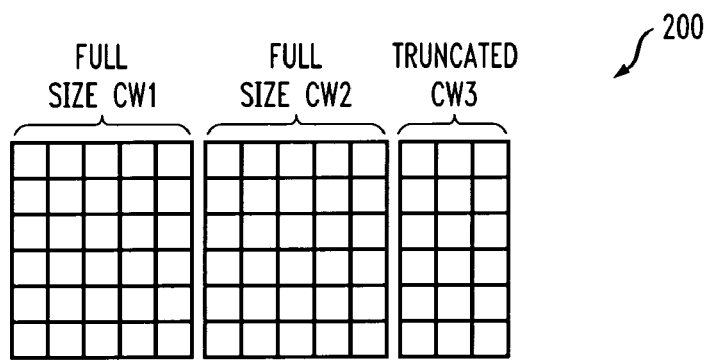
FIG. 2 illustrates an exemplary data stream incorporating features of the present invention.

FIG. 2 illustrates an exemplary data stream 200 incorporating features of the present invention. As shown in FIG. 2, the data stream 200 comprises one or more full size codewords CW1, CW2, and one or more truncated codewords CW3. As used herein, a full size codeword is, for a given system, the largest full codeword (rows by columns) used by the system. In one exemplary implementation, the size of each full size codeword is programmable. Generally, most codewords transmitted in a given system will be full size codewords.

According to one aspect of the present invention, the truncated codewords CW3 are any codeword having a smaller size than the full size codeword. The truncated codewords are used when the data to be transmitted is not a multiple of the full size codeword. In this manner, when a block of data less than a full sized codeword is needed in a given system, a smaller, truncated codeword with fewer columns (or rows or both) may be used. The flexible size of the truncated codeword improves the code rate efficiency.

As shown in FIG. 2, the encoded stream 200 comprises a stream of two dimensional block codewords, each comprising an array of cells, with one bit per cell. As indicated above, the encoded stream 200 includes at least one truncated codeword, arranged according to a truncated number of columns or rows (or both), relative to the full size codeword. The present invention thus optionally supports codewords of programmable size, as well as codewords of truncated size in an iterative decoding system. The full size codeword is a programmable two-dimensional array of rows and columns. The truncated codewords allow the use of fewer columns (or rows) than a full size codeword to improve transmission efficiency. In other words, the truncated codewords of the present invention reduce the granularity of transmission (even though two dimensional block codes typically suggest poor granularity).

Consider a conventional system using only fixed sized codewords of 20 rows×20 columns. Thus, each codeword carries 361 bits of user data and 39 bits for parity (1 row and 1 column). For a detailed discussion of a suitable technique for positioning the parity bits in the codeword, such as interleaved parity techniques, see, for example, U.S. patent application Ser. No. 11/047,914, filed Feb. 1, 2005, entitled "Method and Apparatus for Encoding and Decoding Data Using a Pseudo-Random Interleaver," incorporated by reference herein.

As previously indicated, the full sized codewords are characterized by C, the number of columns in each full size codeword, and R, the number of rows in each full size codeword. Thus, the size of each full size codeword is $C*R$ and the number of parity bits in each full size codeword is $C+R-1$. The total transmission size, T, in number of bits, is equal to the number of user bits, U, plus the number of overhead bits, E (including, for example, TPC, ECC, RLL and all other redundancy bits) in all of the full sized and truncated codewords.

For example, if each codeword includes 20 rows and 20 columns, all transmissions (or storage activities) are multiples of 400 bits, and the code rate is 0.9025 (400−39/400). If a given system implementation transmits or stores data in blocks of 4096 bits, 12 codewords are required per transmission (11 full codewords and one partial codeword (4096/(400−39))). The code rate thus drops to 0.8533 (4096/(12*400)).

It is noted that a given system transmits or stores data in fixed amounts. Thus, the size of the data block to be transmitted or stored by an encoder is known. Likewise, at the decoder, the size of the data block to be received or accessed from a storage medium is known. Thus, given the block size and the number of rows and columns in the full size codewords of a particular system implementation, the number of full size codewords and the size of the final truncated codeword can be easily determined.

Extending the earlier example, the 4096 bits of user data can be transmitted or stored more efficiently with the present invention, using 11 full size codewords CW 1–CW 11 (each carrying 361 bits) and one truncated codeword CW12 (carrying 125 bits). The present invention efficiently transmits data over a range of transmission sizes, T, given a fixed codeword definition (C,R).

Figure 3:
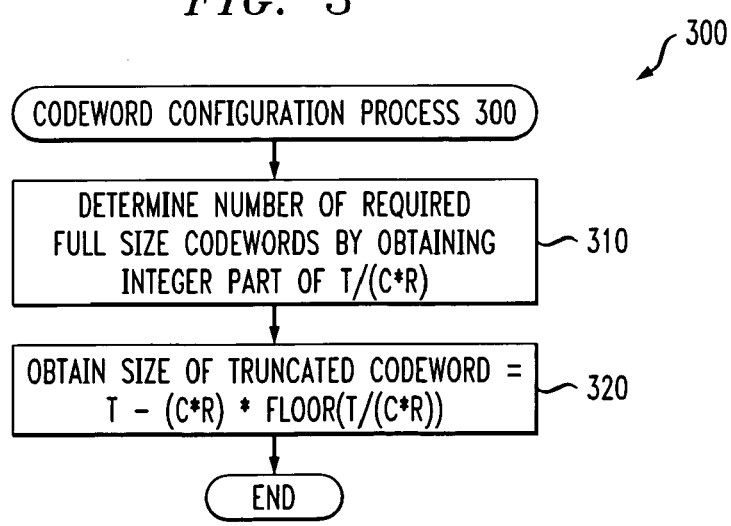
FIG. 3 is a flow chart describing an exemplary implementation of a codeword configuration process incorporating features of the present invention.

FIG. 3 is a flow chart describing an exemplary implementation of a codeword configuration process 300 incorporating features of the present invention. Generally, the codeword configuration process 300 determines the number of full size codewords and the size of the truncated codeword by evaluating the total transmission size, T, relative to the array size. Thus, during step 310, the codeword configuration process 300 determines the number of required full size codewords by obtaining the integer part of the following expression:

$$T/(C*R).$$

The fractional part reflects a single truncated codeword. Thus, the codeword configuration process 300 obtains the size of the truncated codeword (in number of columns) during step 320 by evaluating the following expression:

$$T-(C*R)*\text{floor}(T/(C*R)).$$

Continuing the earlier example, where 20 rows are employed and bits are transmitted or stored in units of 4096 bits, the number of columns in the final truncated codeword CW12 would be seven (six full columns and one partial column).

It is noted that there generally are several different coding steps involved in the encoding/decoding process. For example, TPC is typically the last encoding step before transmission. Further, TPC encoding is typically accompanied by an ancillary 'interleaving' function. Such coding steps are outside the scope of the present invention and have been omitted from the discussion herein for clarity. Generally, the fixed and truncated codewords discussed herein for an exemplary embodiment of the present invention are TPC codewords.

It is to be understood that the embodiments and variations shown and described herein are merely illustrative of the principles of this invention and that various modifications may be implemented by those skilled in the art without departing from the scope and spirit of the invention.

We claim:

1. A method for encoding user data using a two-dimensional block code, comprising:
    encoding a portion of said data in one or more full size codewords; and
    encoding a portion of said data in at least one truncated codeword having a size that is smaller than said full size codeword, wherein a size of said at least one truncated codeword is based on a frame size of said user data.

2. The method of claim 1, wherein said truncated codeword has a fewer number of columns than said one or more full size codewords.

3. The method of claim 1, wherein said truncated codeword has a fewer number of rows than said one or more full size codewords.

4. The method of claim 1, wherein said truncated codeword is identified by counting a number of encoded bits.

5. The method of claim 1, wherein a number of rows and columns in said one or more full size codewords is programmable.

6. The method of claim 1, wherein a number of rows and columns in said one or more full size codewords is fixed.

7. The method of claim 1, wherein a number of said one or more full size codewords is obtained by obtaining the integer part of the following:

$$T/(C*R),$$

where T is a total transmission size, C is a number of columns in said two-dimensional block code, and R is a number of rows in said two-dimensional block code.

8. The method of claim 1, wherein a size of said at least one truncated codeword is obtained by evaluating the following expression:

$$T-(C*R)*\text{floor}(T/(C*R)),$$

where T is a total transmission size, C is a number of columns in said two-dimensional block code, and R is a number of rows in said two-dimensional block code.

9. A system for encoding user data using a two-dimensional block code, comprising:
   a memory; and
   at least one processor, coupled to the memory, operative to:
   encode a portion of said data in one or more full size codewords; and
   encode a portion of said data in at least one truncated codeword having a size that is smaller than said full size codeword, wherein a size of said at least one truncated codeword is based on a frame size of said user data.

10. The system of claim 9, wherein said truncated codeword has a fewer number of columns than said one or more full size codewords.

11. The system of claim 9, wherein said truncated codeword has a fewer number of rows than said one or more full size codewords.

12. The system of claim 9, wherein said truncated codeword is identified by counting a number of encoded bits.

13. The system of claim 9, wherein a number of rows and columns in said one or more full size codewords is programmable.

14. The system of claim 9, wherein a number of rows and columns in said one or more full size codewords is fixed.

15. The system of claim 9, wherein a number of said one or more full size codewords is obtained by obtaining the integer part of the following:

$$T/(C*R),$$

where T is a total transmission size, C is a number of columns in said two-dimensional block code, and R is a number of rows in said two-dimensional block code.

16. The system of claim 9, wherein a size of said at least one truncated codeword is obtained by evaluating the following expression:

$$T-(C*R)*\text{floor}(T/(C*R)),$$

where T is a total transmission size, C is a number of columns in said two-dimensional block code, and R is a number of rows in said two-dimensional block code.

17. A method for decoding user data using a two-dimensional block code, comprising:
   decoding a portion of said data from one or more full size codewords; and
   decoding a portion of said data from at least one truncated codeword having a size that is smaller than said full size codeword, wherein a size of said at least one truncated codeword is based on a frame size of said user data.

18. The method of claim 17, wherein said truncated codeword is identified by counting a number of encoded bits.

19. A system for decoding user data using a two-dimensional block code, comprising:
   a memory; and
   at least one processor, coupled to the memory, operative to:
   decode a portion of said data from one or more full size codewords; and
   decode a portion of said data from at least one truncated codeword having a size that is smaller than said full size codeword, wherein a size of said at least one truncated codeword is based on a frame size of said user data.

20. The system of claim 19, wherein said truncated codeword is identified by counting a number of encoded bits.

* * * * *